(12) United States Patent
Lee et al.

(10) Patent No.: US 7,919,795 B2
(45) Date of Patent: Apr. 5, 2011

(54) WIRE STRUCTURE, METHOD FOR FABRICATING WIRE, THIN FILM TRANSISTOR SUBSTRATE, AND METHOD FOR FABRICATING THE THIN FILM TRANSISTOR SUBSTRATE

(75) Inventors: Je-Hun Lee, Seoul (KR); Chang-Oh Jeong, Suwon-si (KR); Eun-Guk Lee, Yongin-si (KR); Do-Hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 232 days.

(21) Appl. No.: 11/961,149

(22) Filed: Dec. 20, 2007

(65) Prior Publication Data
US 2008/0149930 A1 Jun. 26, 2008

(30) Foreign Application Priority Data

Dec. 21, 2006 (KR) .................. 10-2006-0131473
May 25, 2007 (KR) .................. 10-2007-0050697

(51) Int. Cl.
*H01L 29/76* (2006.01)
*H01L 29/40* (2006.01)
*H01L 29/43* (2006.01)
*H01L 29/49* (2006.01)
*H01L 33/00* (2010.01)

(52) U.S. Cl. ......... 257/288; 257/E29.139; 257/E29.111; 257/E29.151; 257/E29.16; 257/E29.159; 257/E29.158; 257/E33.063

(58) Field of Classification Search ........... 257/E33.063, 257/E33.062, E29.139, 228, E29.273, 288, 257/E29.111, E29.151, E29.16, E29.159, 257/E29.158

See application file for complete search history.

(56) References Cited

U.S. PATENT DOCUMENTS

| | | | | |
|---|---|---|---|---|
| 6,201,590 | B1 * | 3/2001 | Ohta et al. | 349/141 |
| 6,255,706 | B1 * | 7/2001 | Watanabe et al. | 257/412 |
| 6,803,975 | B2 * | 10/2004 | Kim et al. | 349/43 |
| 7,157,323 | B2 * | 1/2007 | Gan et al. | 438/197 |
| 2007/0093003 | A1 * | 4/2007 | Wu et al. | 438/149 |
| 2008/0009108 | A1 * | 1/2008 | Lin et al. | 438/158 |

* cited by examiner

*Primary Examiner* — Phat X Cao
*Assistant Examiner* — Diana C Garrity
(74) *Attorney, Agent, or Firm* — Innovation Counsel LLP

(57) ABSTRACT

Provided are a wire structure, a method for fabricating a wire, a thin film transistor (TFT) substrate and a method for fabricating a TFT substrate. The wire structure includes a barrier layer formed on a substrate and including copper, copper solid solution layer.

35 Claims, 12 Drawing Sheets

WIRE STRUCTURE, METHOD FOR FABRICATING WIRE, THIN FILM TRANSISTOR SUBSTRATE, AND METHOD FOR FABRICATING THE THIN FILM TRANSISTOR SUBSTRATE

BACKGROUND OF THE INVENTION

This application claims priority from Korean Patent Application No. 10-2006-0131473, filed on Dec. 21, 2006 and Patent Application No 10-2007-0050697 filed on May 25, 2007, in the Koran Intellectual Property Office, the disclosure of which is incorporated herein in its entirety by reference.

1. Field of the Invention

The present invention relates to a wire structure, and more particularly, to a wire structure including Copper (Cu) or a copper alloy and a copper solid solution, a method for fabricating a wire, a thin film transistor (TFT) substrate, and a method for fabrication the TFT substrate.

2. Description of the Related Art

A thin film transistor (TFT) substrate is used as a substrate for a liquid crystal display (LCD) having pixels in a matrix array and an organic electro luminescence (EL) display. An LCD, which is one of the most widely used flat panel displays, includes two substrates having a plurality of electrodes and a liquid crystal layer interposed there between and adjusts the amount of light transmitted there through by applying a voltage to the electrodes to rearrange liquid crystal molecules in the liquid crystal layer. In the LCD, thin film transistors are used as switching elements for controlling picture signals applied to the respective electrodes.

An organic electroluminescence (EL) display device displays a picture by electrically exciting phosphorescent organic material, and includes a driving TFT for supplying pixels with current necessary for light emission and a switching TFT.

As the display area of the LCD or the organic EL display device increases, the gate lines and the data lines connected to the TFTs also grow longer, causing an increase in the resistance of a wire. To solve a signal delay problem resulting from the increase in the resistance, the gate lines and the data lines should be formed of a material having as low of a resistivity as possible.

In addition, for improvement of the reliability of the wire, the wire is required to have good adhesion and to be patterned with a good profile.

SUMMARY OF THE INVENTION

The present invention provides a thin film transistor (TFT) substrate having a copper wire structure that exhibits improved adhesion and a superior lateral profile.

The present invention also provides a method for fabricating the TFT substrate.

According to an aspect of the present invention, there is provided a wire structure that includes a copper solid solution layer formed on a substrate.

According to another aspect of the present invention, there is provided a method for fabricating a wire, the method including forming a barrier layer including a copper solid solution layer, forming a copper conductive layer including copper or a copper alloy on the barrier layer.

According to still another aspect of the present invention, there is provided a TFT substrate including gate wires and a gate line extending in a first direction, a gate electrode connected to the gate line on an insulating substrate, data wires insulated from the gate wires, a data line extending in a second direction and intersecting the gate line, a source electrode connected to the data line, a drain electrode spaced apart from the source electrode on the insulating substrate, and a pixel electrode formed for each pixel and connected to the drain electrode on the gate wires and the data wires, wherein the gate wires and/or the data wires include a barrier layer formed on a substrate and include a copper solid solution layer.

According to a further aspect of the present invention, there is provided a method for fabricating a thin film transistor (TFT) substrate, the method includes forming gate wires including a gate line extending in a first direction and a gate electrode connected to the gate line on an insulating substrate, forming data wires insulated from the gate wires and including a data line extending in a second direction and intersecting the gate line, a source electrode connected to the data line, and a drain electrode spaced apart from the source electrode on the insulating substrate, and forming a pixel electrode connected to the drain electrode for each pixel on the gate wires and the data wires, wherein the formation of the gate wires and/or the data wires includes forming a barrier layer including a copper solid solution layer.

BRIEF DESCRIPTION OF THE DRAWINGS

The above and other features and advantages of the present invention will become more apparent by describing in detail exemplary embodiments thereof with reference to the attached drawing in which.

DETAILED DESCRIPTION OF THE INVENTION

Figure 1:
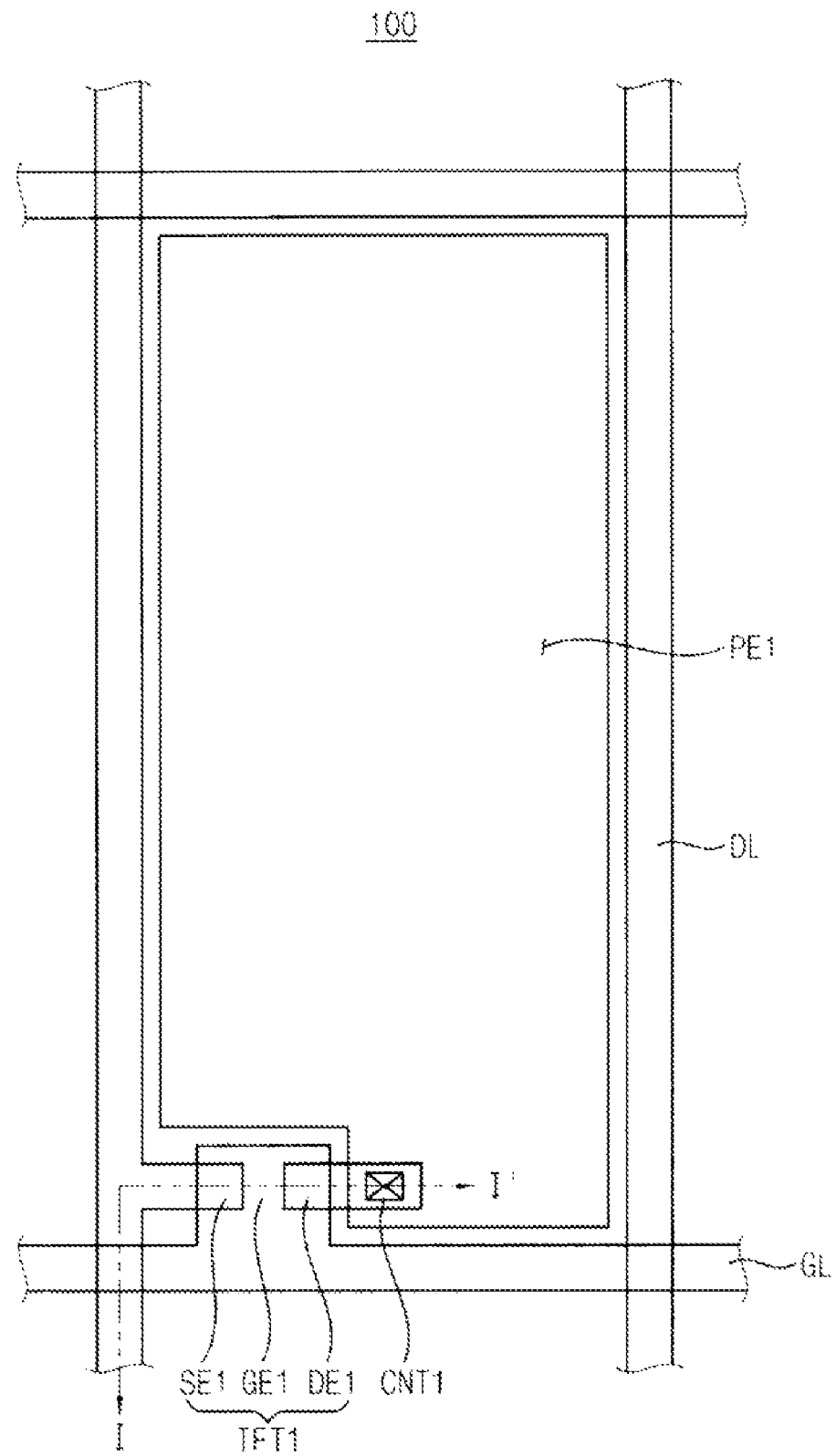
FIG. 1 is a plan view of a TFT substrate according to an embodiment of the present invention.

The present invention will now be described more fully hereinafter with reference to the accompanying drawings, in which preferred embodiments of the invention are shown.

This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Figure 2:
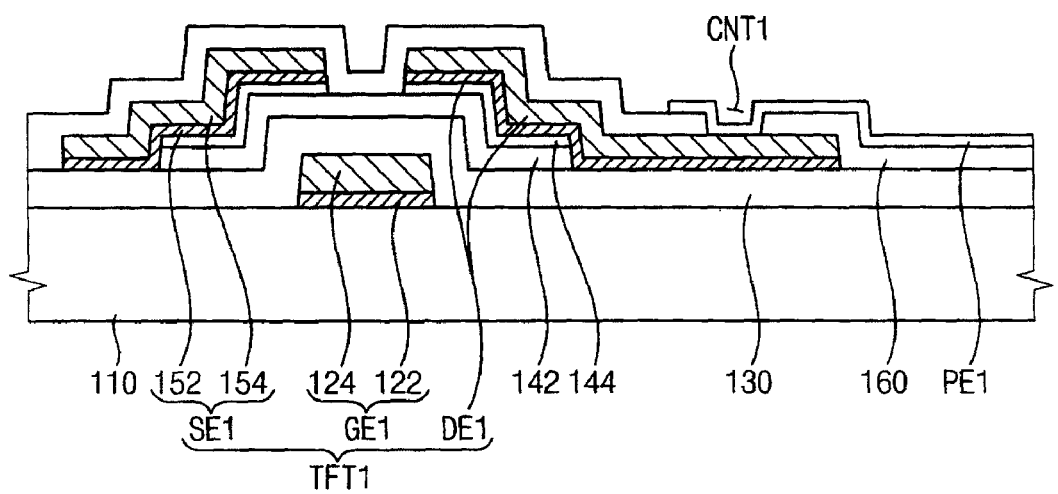
FIG. 2 is a sectional view taken along a line I-I' in FIG. 1

Hereinafter, a wire structure and a method for fabricating a wire according to an embodiment of the present invention will be described with reference to accompanying drawings. FIG. 1 is a plain view of a TFT substrate according to an embodiment of the present invention. FIG. 2 is a sectional view taken along a line I-I' in FIG. 1.

Referring to FIG. 1, $1^{st}$ thin film transistor (TFT) substrate (100) includes a gate line (GL) formed on the substrate. Source line (DL) intersects the gate line (GL), $1^{st}$ TFT (TFT 1) is connected to gate line (GL) and source line (DL), and $1^{st}$ pixel electrode (PE1) is electrically connected to the $1^{st}$ TFT1. The $1^{st}$ TFT (TFT 1) includes a gate electrode connected to gate line (GL), $1^{st}$ source electrode (SE1) connected to source line (DL), and a $1^{st}$ drain electrode spaced apart from the source electrode.

Referring to FIG. 2, The $1^{st}$ TFT (TFT 1) further includes a $1^{st}$ gate insulating layer (130), $1^{st}$ semiconductor layer (142), ohmic contact layer (144) and $1^{st}$ passivation layer (160). The $1^{st}$ drain electrode and $1^{st}$ pixel electrode are connected electrically through the contact hole formed to expose a portion of the drain electrode.

The $1^{st}$ TFT (TFT1) includes the gate electrode connected to gate line (GL), $1^{st}$ source electrode (SE1) connected to source line (DL), $1^{st}$ drain electrode spaced apart from the source electrode. The $1^{st}$ drain electrode and $1^{st}$ pixel electrode are connected electrically through the contact hole formed to expose a portion of the drain electrode.

The gate line and $1^{st}$ gate electrode (GE1) is formed on the substrate by patterning the $1^{st}$ gate metal layer (122,124). The $1^{st}$ gate metal layer (122,124) includes $1^{st}$ copper solid solution (122) and $1^{st}$ copper layer (124). The $1^{st}$ copper solid solution (122) is formed under the $1^{st}$ copper layer (124) in direct contact with substrate (110).

The $1^{st}$ copper solid solution layer (122) is composed of copper and at least one of oxygen and nitrogen. Atoms of oxygen and nitrogen interstitially stay in the empty space of the copper structure which is a FCC (Face Centered Cubic) structure. Using copper for a signal line, the signal delay problem can be solved. Because it has low resistance.

The thickness of the copper solid solution layer in this embodiment of the invention may be in the range of 30 Å-1000 Å. The $1^{st}$ copper layer (124) may be a pure copper. The $1^{st}$ copper layer may also be made of an alloy which has copper and one of Mo, Nb, Ti, Zr, W, Ta, and V. Using the copper for gate line materials, signal delay problem of gate line will be solved. Because it has low resistance.

To form $1^{st}$ copper solid solution layer (122), place substrate (110) in the chamber to form a copper layer on the substrate and inject a reactive gas such as O2 and/or N2 into the chamber. The $1^{st}$ copper solid solution layer (122) is formed on the insulating substrate (110) by sputtering the copper. In order to avoid the formation of copper oxide and/or copper nitride, the O2 gas and/or N2 gas can be controlled preventing the copper from reacting directly with O2 gas and/or N2 gas. The $1^{st}$ copper layer (124) on the $1^{st}$ gate metal layer (122,124) is formed on the $1^{st}$ copper solid solution (122) layer on the substrate by sputtering. By patterning the $1^{st}$ gate metal layer (122,124), the gate line (GL) and 1st gate electrode (GE1) is formed.

On the surface of the $1^{st}$ substrate (110), electrons which have dangling bonds exist. These electrons are outer electrons that are not combined completely to each other. These electrons have dangling bonds and combine with oxygen or nitrogen rather than the copper atoms.

Especially when forming the $1^{st}$ copper solid solution which contacts the $1^{st}$ substrate (110), some of the copper solid solution makes an oxidation or nitrization. Accordingly, the copper in the $1^{st}$ copper solid solution layer (122) is changed into the $CuO_2$ or CuO or $CuN_x$ or solid solution metal which has oxygen and/or nitrogen. This results in the improvement of adhesiveness between the copper layer and the substrate (110).

In a succeeding process including heat treatment, atoms of copper in a copper solid solution may be oxidized by atoms of oxygen or nitrided by atoms of nitrogen in a copper solid solution. Accordingly, the copper in the 1$^{st}$ copper solid solution layer (122) is changed into the CuO2 or CuO or CuNx or solid solution metal which has oxygen and/or nitrogen. This results in the improvement of adhesiveness between the copper layer and the substrate (110).

The 1$^{st}$ gate insulating layer (130) is formed on the substrate (110) including the gate line (GL) and gate electrode (GE1). The gate insulating layer (130) may be a SiNy. The gate insulating layer may include a (Si(Ox, N(–X)) ($0 \leq x \leq 1$)) layer which has silicon and at least one of oxygen and nitrogen. The gate insulating layer can be either a single SiNy layer or a multi layer which includes a SiNy layer and a (Si(Ox, N(–X)) ($0 \leq x \leq 1$)) layer which has silicon and at least one of oxygen or nitrogen.

The 1$^{st}$ semiconductor pattern (142,144) is formed on the 1$^{st}$ gate insulating layer (130). The 1$^{st}$ semiconductor pattern corresponds to the 1st gate electrode (GE1). The 1$^{st}$ semiconductor pattern (142,144) includes semiconductor layer (142) and ohmic contact layer (144) formed on the semiconductor layer (142). The semiconductor layer (142) is composed of amorphous silicon (a-Si), and the ohmic contact layer (144) composed of n+ amorphous silicon (n+a-Si) which is heavily doped with n type impurities.

The source line (DL), the 1$^{st}$ source electrode (SE1) and 1$^{st}$ drain electrode (DE1) are formed on the substrate (110). A semiconductor pattern (142,144) is formed on substrate (110) by patterning the 1$^{st}$ source metal layer (152,154). The 1$^{st}$ source metal layer (152,154) includes 2$^{nd}$ copper solid solution layer (152) and 2$^{nd}$ copper layer (154). The 2$^{nd}$ copper solid solution layer (152) is formed under the 2$^{nd}$ copper layer (154) to contact the substrate directly.

The 2$^{nd}$ copper solid solution layer (152) is composed of copper and at least one of oxygen and nitrogen. Atoms of oxygen and nitrogen interstitially stay in the empty space of the copper structure which is a FCC (Face Centered Cubic) structure.

The thickness of the copper solid solution may be in a range of 30 Å-1000 Å. The 2$^{nd}$ copper layer (154) may be a pure copper. And also the 2$^{nd}$ copper layer (154) may be an alloy which has copper and one of Mo, Nb, Ti, Zr, W, Ta, and V.

The 2$^{nd}$ copper solid solution layer (152) is formed under the 2$^{nd}$ copper layer (154) and prevents a reaction between 1$^{st}$ semiconductor pattern (142,144) and 2$^{nd}$ copper layer (154). This layered structure helps to prevent reaction between silicon atoms of the 1$^{st}$ semiconductor pattern (142,144) and atoms of the 2$^{nd}$ copper layer (154). In other words, the silicon atom in the 1$^{st}$ semiconductor pattern (142,144) can not react with atoms of the copper atom in the 2$^{nd}$ copper layer (154), because the oxygen or nitrogen atoms in the copper solid solution layer react with the silicon atoms and diffuse from the 1$^{st}$ semiconductor pattern (142,144) before the copper atoms in the 2$^{nd}$ copper layer (154) react.

The semiconductor pattern, ohmic contact layer, source line, and drain electrode in one embodiment of the invention can be formed by only 1 photo lithography process. In other embodiments of the invention, the semiconductor pattern, ohmic contact layer, source line and drain electrode can be formed by photo lithography process with more than 1 mask.

1$^{st}$ passivation layer (160) is formed on the 1$^{st}$ substrate (110) which source line (SL), source electrode (SE1) and drain electrode (DE1) are formed. The 1$^{st}$ passivation layer (160) may include Silicon Nitride (SiNy). The 1$^{st}$ passivation layer (160) includes contact hole (CNT1) which exposes a portion of the 1$^{st}$ drain electrode (DE1). Through the contact hole (CNT1), the 1st pixel electrode (PE1) is connected with the 1$^{st}$ TFT electrically.

1st pixel electrode (PE1) may include Indium Tin Oxide (ITO) or Indium Zinc Oxide (IZO) which are transparent and conductive. Between the 1$^{st}$ passivation layer (160) and 1$^{st}$ pixel electrode (PE1), there can be an organic layer to make a flat layer. This organic layer may enhance the aperture of pixel area by overlapping the pixel electrode and a portion of the data line.

Figure 3:
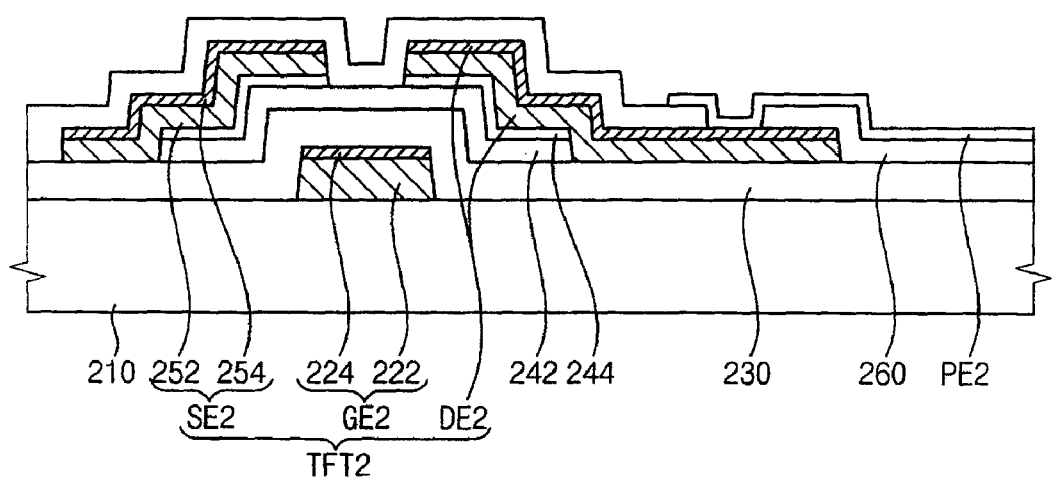
FIGS. 3 to 5 are sectional views of a TFT substrate according to an embodiment of the present invention.
Figure 4:
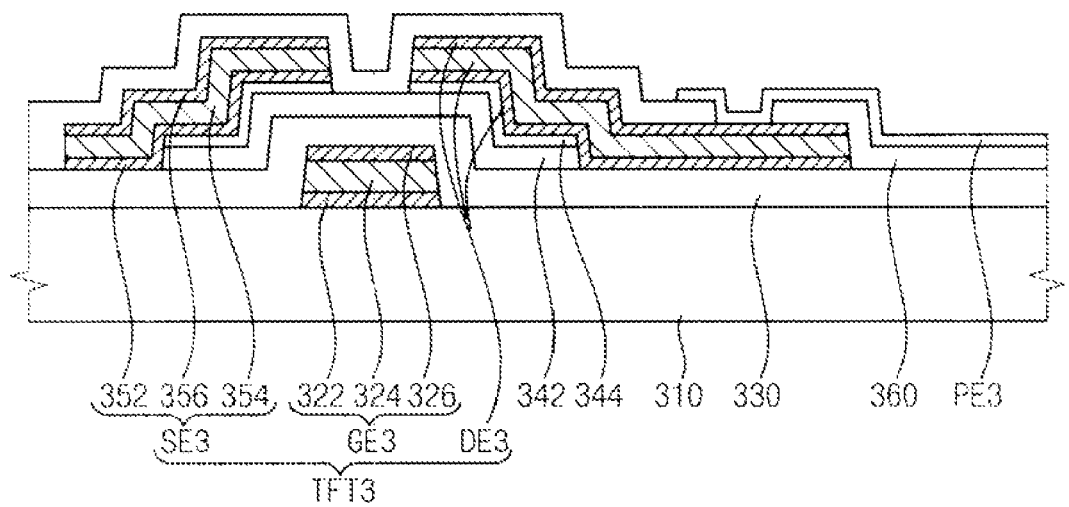
Figure 5:
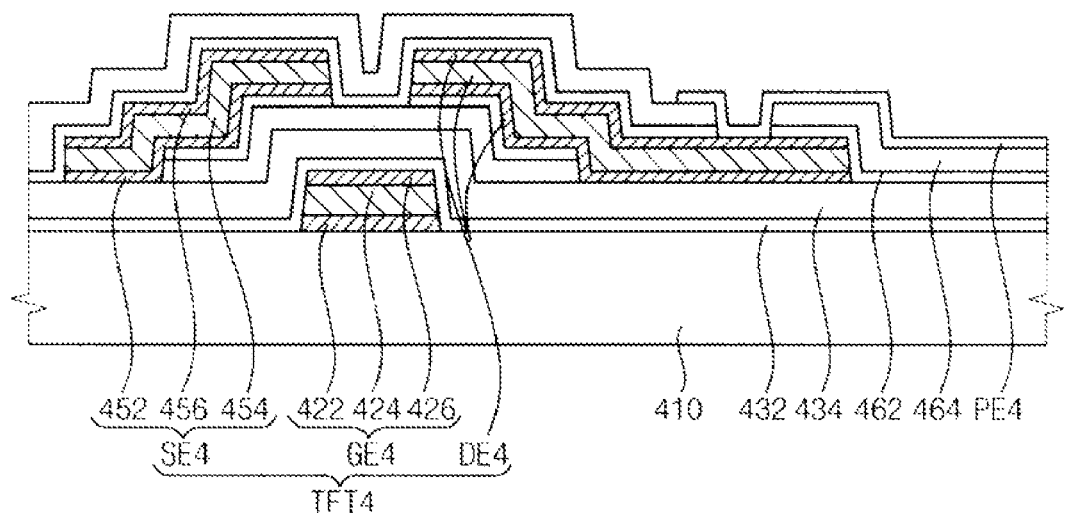

Referring to FIG. 3 to FIG. 5, sectional views of a TFT substrate according to an embodiment of the present invention are illustrated. Each gate line formed on each thin film transistor substrate, gate electrode, source line, source electrode and drain electrode are substantially the same. In terms of the thin film transistor 2, 3, 4, differences compared to the transistor depicted in FIGS. 1 and 2 will be explained.

Referring to FIG. 3, 2$^{nd}$ TFT substrate (200) includes 2$^{nd}$ TFT (TFT2) and 2$^{nd}$ pixel electrode (PE2) connected with the 2$^{nd}$ TFT (TFT2).

The 2$^{nd}$ gate electrode (GE2) is formed on the substrate by patterning the 2$^{nd}$ gate metal layer (222,224). The 2$^{nd}$ gate metal layer (222,224) includes 3$^{rd}$ copper solid solution layer (224) and 3$^{rd}$ copper layer (222). The 3$^{rd}$ copper layer (222) may be a pure copper. The 3$^{rd}$ copper layer (222) may also be an alloy which has copper and one of Mo, Nb, Ti, Zr, W, Ta, and V.

The 3$^{rd}$ copper solid solution layer (224) is formed over the 3$^{rd}$ copper layer (222) to contact the substrate directly. The 3$^{rd}$ copper solid solution layer (224) is composed of copper and at least one of oxygen atoms or Nitrogen atoms. The atoms of oxygen or nitrogen interstitially stay in the empty space of the copper lattice structure which is a FCC (Face Centered Cubic) structure in one embodiment of the invention. The thickness of the copper solid solution layer may be in a range of 30 Å-1000 Å.

The 2$^{nd}$ gate insulating layer (230) is formed on the 2$^{nd}$ substrate (210) including the gate line and gate electrode (GE2). The 2$^{nd}$ gate insulating layer (230) may be a SiNy. The gate insulating layer may include a (Si(Ox, N(1–X)) ($0 \leq x \leq 1$)) layer which has silicon and at least one of oxygen or nitrogen. The gate insulating layer can be either a single layer of the SiNy layer or a multi layer that includes the SiNy layer and (Si(Ox, N(1–X)) ($0 \leq x \leq 1$)) layer which has silicon and at least one of oxygen or nitrogen.

The 2$^{nd}$ semiconductor pattern (242,244) is formed on the 2$^{nd}$ substrate (210). 2$^{nd}$ source electrode (SE2) and drain electrode (DE2) are formed by patterning. The 2$^{nd}$ source metal layer (252, 254) includes 4$^{th}$ copper layer (252) and 4$^{th}$ copper solid solution layer (254) formed on the 4$^{th}$ copper layer (252).

The 2$^{nd}$ passivation layer (260) is formed on the substrate after patterning the source metal layer. 2$^{nd}$ pixel electrode (PE2) is formed on the layer and connected to the drain electrode (DE2).

In general, the silicon atom in the 2$^{nd}$ gate insulating layer (230) and 2$^{nd}$ passivation layer (260) is very reactive with copper atoms. Accordingly, in the processes to form the 2$^{nd}$ gate insulating layer (230) and 2$^{nd}$ passivation layer (260), copper-silicon (Cu3Si, Cu5Si) is formed through a reaction between silane gas and copper in a chamber in which the Silane (SiH4), Ammonia (NH3) and Hydrogen (H2) gases are injected. The copper-silicon (Cu3Si, Cu5Si) is separated into copper and silicon after some time or during a proceeding heat process. Thus, the silicon atom is diffused into the copper layer. This causes an increase in resistance in the copper layer.

But according to an embodiment of the present invention, by forming 3$^{rd}$ and 4$^{th}$ copper solid solution layer (224, 254) on the 3$^{rd}$ and 4$^{th}$ copper layer (222,252), the silicon atoms in the 2$^{nd}$ gate insulating layer (230) and the 2$^{nd}$ passivation layer (260) react with the oxygen and/or nitrogen in the copper solid solution layer so that resistance of copper layer (222,252) will not increase. This is because the reactivity between the silicon and oxygen or nitrogen is higher than that between silicon and copper.

In FIG. 2 and FIG. 3 through the structure of the copper solid solution layer on/under the copper layer, effectiveness of each structure is explained. The gate line and electrode are formed by patterning the gate metal layer so that the copper solid solution layer and copper layer are staggered by order along with the source line, source electrode and drain electrode.

These embodiments are not limited to the normal Thin Film Transistor which means that these embodiments can be applied to the TFT substrate having a color filter.

Referring to FIG. 4, the $3^{rd}$ Thin Film Transistor substrate (300) includes $3^{rd}$ gate electrode (GE3) of the $3^{rd}$ TFT (TFT3) formed on the $3^{rd}$ insulating substrate (300), $3^{rd}$ gate insulating layer (330), and $3^{rd}$ semiconductor pattern layer (342, 344) which are formed sequentially. And also includes $3^{rd}$ source electrode (SE3) and $3^{rd}$ drain electrode (DE3) which are formed after these processes. $3^{rd}$ passivation layer (360) and $3^{rd}$ pixel electrode (PE3) connected to the $3^{rd}$ TFT (TFT3) are also formed.

The $3^{rd}$ gate electrode (GE3) is composed of $3^{rd}$ gate metal layer (322,324,326) formed on the $3^{rd}$ insulating substrate (310). $3^{rd}$ source electrode (SE3), and drain electrode (DE3) composed of $3^{rd}$ metal layer (352,354,356) are formed on the $3^{rd}$ insulating substrate (310) after forming semiconductor patterns (342,344). The $3^{rd}$ gate metal layer (322,324,326) and $3^{rd}$ source metal layer (352,354,356) may include $5^{th}$ copper solid solution layer (322,352), $5^{th}$ copper layer (324, 354) and $6^{th}$ copper solid solution layer (326,356). The $5^{th}$ copper layer (324,354) may be a pure copper. And also the $5^{th}$ copper layer (324,354) may be an alloy which has copper and one of Mo, Nb, Ti, Zr, W, Ta, and V. The $5^{th}$ and $6^{th}$ copper solid solution layer (322,352,324,354) is composed of copper and at least one of oxygen atoms or Nitrogen atoms. The atoms of oxygen or nitrogen interstitially stay in the empty space of the copper-lattice structure which is a FCC (Face Centered Cubic) structure. The thickness of the copper solid solution layer may be in a range of 30 Å-1000 Å.

The $3^{rd}$ gate insulating layer (330) and the $3^{rd}$ passivation layer (360) are formed by (Si(Oy, N(1-y)) (0≦y≦1)) layer which has silicon and at least one of oxygen or nitrogen. The $3^{rd}$ gate insulating layer (330) and the $3^{rd}$ passivation layer (360) can be formed by injecting the Silane (SiH4), Ammonia (NH3) and Hydrogen (H2) gases in the chamber that the substrate is deposited. In the above process, the silicon atom in the Silane reacts with copper easily to have a lot of impurities in the copper layer.

By injecting N2O which has better reactivity with silicon than copper, the (Si(Oy, N(1-y)) (0≦y≦1)) layer which has silicon and at least one of oxygen or nitrogen can be formed. This layer can prevent the silicon atom and metal layer having copper formed under the $3^{rd}$ gate insulating layer (330) and $3^{rd}$ passivation layer (360) from reacting with each other. NO, O2 gas also can be injected. Through this process, increase of resistance of the $5^{th}$ copper layer (326,356) can be prevented due to $3^{rd}$ gate insulating layer (330) and $3^{rd}$ passivation layer (360).

These embodiments are not limited to the normal Thin Film Transistor which means these embodiments can be applied to a TFT substrate having a color filter.

Referring to FIG. 5, $4^{th}$ Thin Film Transistor substrate (400) includes a $4^{th}$ TFT (TFT4) including $4^{th}$ gate electrode (GE4), $4^{th}$ source electrode (SE4) and $4^{th}$ drain electrode (DE4) and $4^{th}$ pixel electrode (PE4) connected to the $4^{th}$ TFT (TFT4) electrically.

The $4^{th}$ gate electrode (GE4) is formed by $4^{th}$ gate metal layer (422,424,426) including $1^{st}$ metal layer (422) including Mo, $6^{th}$ copper layer (424), $7^{th}$ copper solid solution layer (426). The $1^{st}$ metal layer (422) enhances the adhesiveness between $6^{th}$ copper layer (424) and $4^{th}$ insulating substrate (410). The $1^{st}$ metal layer (422) can be either a pure Mo layer or Mo alloy metal. The Mo alloy metal includes MoNb, MoTi, MoZr, MoW, MoCr, MoTa and so on. The $4^{th}$ source electrode (SE4) and $4^{th}$ drain Electrode (DE4) can be formed by $4^{th}$ source metal layer (452,454,456) including $2^{nd}$ metal layer (452) including Mo, $7^{th}$ copper layer (454), $8^{th}$ copper solid solution layer (456).

The $4^{th}$ gate insulating layer (432) is formed on the $4^{th}$ substrate (410) including the gate line and gate electrode. The $4^{th}$ gate insulating layer (432) may be a SiNy. The gate insulating layer (432) may include a (Si(Oy, N(1-y)) (0≦y≦1)) layer which has silicon and at least one of oxygen or nitrogen. The gate insulating layer can be either a single layer of the SiNy layer or multi layer that includes the SiNy layer and (Si(Ox, N(1-X)) (0≦x≦1)) layer which has silicon and at least one of oxygen or nitrogen. The density of $4^{th}$ gate insulating layer (432) is denser than that of $1^{st}$ gate insulating layer (130). But considering the forming time, the $1^{st}$ gate insulating layer (130) can be formed earlier than $4^{th}$ gate insulating layer (432) because the $4^{th}$ gate insulating layer (432) forming time takes longer than that of $1^{st}$ gate insulating layer (130). In the above case, the $4^{th}$ gate insulating layer (432) is like a barrier layer which prevents reaction between the copper atom in $4^{th}$ gate electrode (GE4) and silicon. The $1^{st}$ gate insulating layer (130) insulates the 4th gate electrode (GE4).

The $4^{th}$ passivation layer(460 420) is formed after forming $4^{th}$ source electrode(SE4), and $4^{th}$ drain electrode(DE4) with the (Si (Oy, N (1-y)) (0<y<1)) layer which has silicon and at least one of oxygen or nitrogen. $2^{nd}$ passivation layer (464) which is SiNy can be formed more to insulate the $4^{th}$ source electrode (SE4), and $4^{th}$ drain electrode (DE4).

Figure 6:
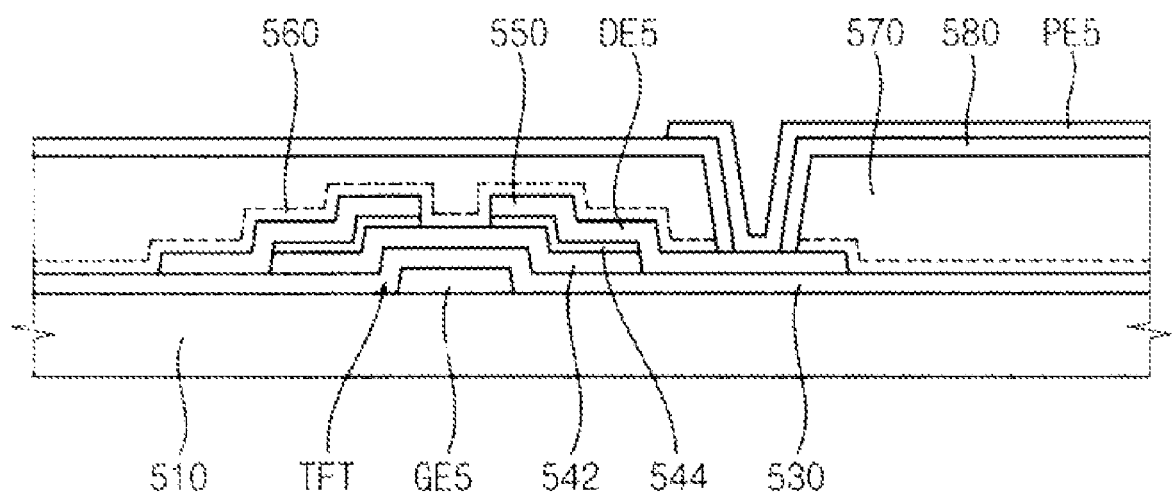
FIG. 6 is a sectional view of a TFT substrate which has a color filter according to an embodiment of the present invention.

FIG. 6 is a sectional view of a TFT substrate which has a color filter according to an embodiment of the present invention.

Referring to FIG. 6, color filters (570) are formed on the substrate (510) that the Thin Film Transistor (TFT) is formed. Methods to form color filter (570) can be a gravure printing method or inkjet printing method.

Figure 7A:
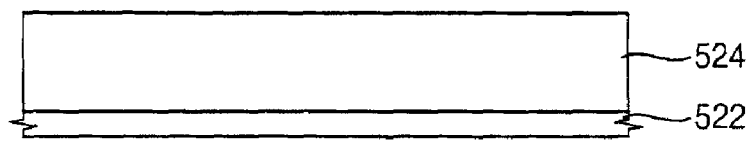
FIGS. 7a-7d each illustrate sectional views of a gate electrode extended from the gate line in FIG. 6 according to an embodiment of the present invention.

FIG. 7a is a sectional view of a gate electrode extended from the gate line in FIG. 6 according to an embodiment of the present invention.

Referring to FIG. 7a, the gate metal layer includes copper layer (524) and copper solid solution layer (522) (Cu(N(x)O (1-x)), 0≦x≦1, 0<a<1) including at least one of oxygen and nitrogen atoms. Thickness of the copper solid solution layer may be in a range of 30 Å-1000 Å. The copper solid solution layer is formed under the copper layer.

Figure 7B:
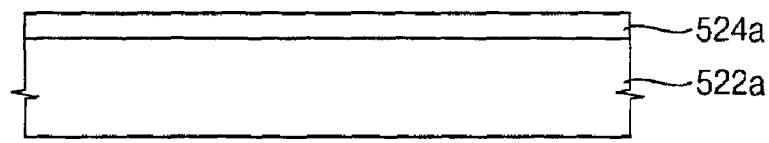

FIG. 7b is a sectional view of a gate electrode extended from the gate line in FIG. 6 according to another embodiment of the present invention.

Referring to FIG. 7b, the gate metal layer includes copper layer (522a) and copper solid solution layer (524a) (Cu(N(x) O(1-x)), 0≦x≦1, 0<a<1) including at least one of oxygen and nitrogen. The copper solid solution layer is formed on the copper layer.

Figure 7C:
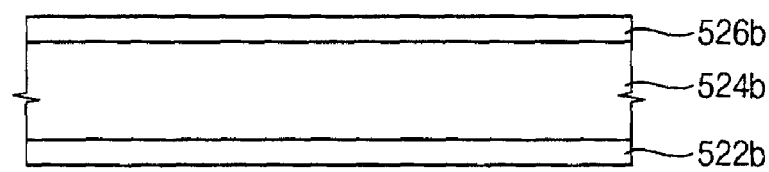

FIG. 7c is a sectional view of a gate electrode extended from the gate line in FIG. 6 according to another embodiment of the present invention.

Referring to FIG. 7c, the gate metal layer can be a multi layer having a copper layer (524b) disposed between $1^{st}$ copper solid solution layer (522b) and $2^{nd}$ copper solid solution layer (526b).

The $1^{st}$ copper solid solution layer (522b) is formed under the 1st copper layer (524b) to contact to the substrate (510) directly. $2^{nd}$ copper solid solution layer (526b) can be formed on the copper layer (524b). As a result, the adhesiveness to the substrate (510) will increase and the increase of the copper layer can be prevented.

Figure 7D:
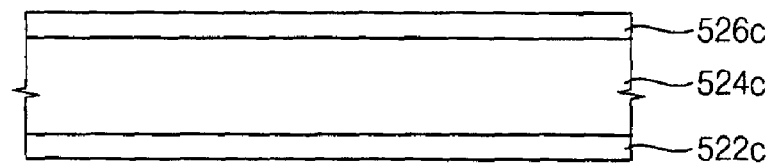

FIG. 7d is a sectional view of a gate electrode extended from the gate line in FIG. 6 according to another embodiment of the present invention.

Referring to FIG. 7d, the gate metal layer (522c,526c) can be a multi layer including copper layer (524c), metal layer (522c) formed under the copper layer (524c) and copper solid solution layer (526c) formed on the copper layer (524c).

Referring back to FIG. 6, gate insulating layer (530) insulates between gate electrode (GE5) and the semiconductor pattern. The gate insulating layer (530) may be a SiNy. The gate insulating layer (530) may include a (Si(Ox, N(-X)) ($0 \leq x \leq 1$)) layer which has silicon and at least one of oxygen or nitrogen. The gate insulating layer (530) can be either a single layer of the SiNy layer or a multi layer that includes the SiNy layer and (Si(Ox, N(-X)) ($0 \leq x \leq 1$)) layer which has silicon and at least one of oxygen or nitrogen.

The semiconductor pattern (542,544) is formed on the $1^{st}$ gate insulating layer (530). The semiconductor pattern (542, 544) corresponds to the gate electrode (GE5). The semiconductor pattern (542,544) includes semiconductor layer (542) and ohmic contact layer (544) formed on the semiconductor layer (542). The semiconductor layer (542) is composed of amorphous silicon (abbreviated to a-Si). The ohmic contact layer (544) is composed of n+ amorphous silicon (abbreviated to n+a-Si) heavily doped with n type impurities. A data metal layer pattern (550) is then formed which contains source line, source electrode (SE5) and drain electrode (DE5).

Figure 8A:
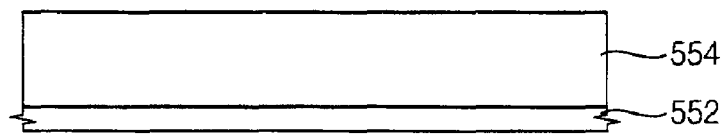
FIGS. 8a-8d each illustrate sectional views of a data line, a source electrode and a drain electrode according to an embodiment of the present invention.

FIG. 8a is a sectional view of a data line, a source electrode and a drain electrode according to an embodiment of the present invention.

Referring to FIG. 8a, the data metal layer (550 IN FIG. 6) includes copper layer (554) and copper solid solution layer (552) (Cu(N(x)O(1-x)), $0 \leq x \leq 1$, $0 < a < 1$) including at least one of oxygen and nitrogen. The thickness of the copper solid solution may be in a range of 30 Å-1000 Å. The copper solid solution layer is formed under the copper layer.

The semiconductor pattern, ohmic contact layer, source line, and drain electrode in this embodiment of the invention can be formed in one embodiment of the invention using only 1 photo lithography process. In other embodiments of the invention, the semiconductor pattern, ohmic contact layer, source line and drain electrode can be formed by photo lithography process with more than 1 mask.

Figure 8B:
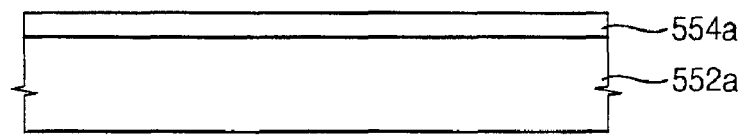

FIG. 8b is a sectional view of a data line, a source electrode and a drain electrode according to an embodiment of the present invention.

Referring to FIG. 8b, the data metal layer (550 IN FIG. 6) includes copper layer (554a) and copper solid solution layer (552a) (Cu(N(x)O(1-x)), $0 \leq x \leq 1$, $0 < a < 1$) including at least one of oxygen and nitrogen. The copper solid solution layer (552a) is formed on the copper layer (554a).

Figure 8C:
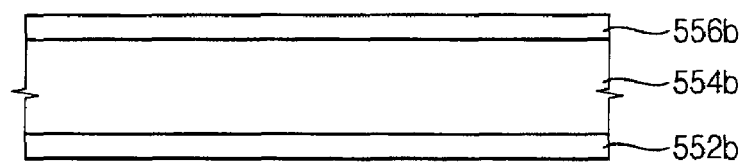

FIG. 8c is a sectional view of a data line, a source electrode and a drain electrode according to an embodiment of the present invention.

Referring to FIG. 8c, data metal layer (550 IN FIG. 6) can be a multi layer in which copper layer (554b) is disposed between $1^{st}$ copper solid solution layer (552b) and $2^{nd}$ copper solid solution layer (556b).

Figure 8D:
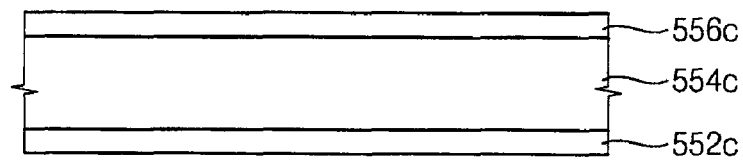

FIG. 8d is a sectional view of a data line, a source electrode and a drain electrode according to an embodiment of the present invention.

Referring to FIG. 8d, the data metal layer (550 IN FIG. 6) can be a multi layer including copper layer (554c), metal layer (552c) formed under the copper layer (554c) and a copper solid solution layer (556c) formed on the copper layer.

Referring back to FIG. 6, protection insulating layer (560) can be formed on the data metal layer. The color filter layer (570) is formed on the substrate having the data metal layer pattern or having the protection insulating layer. The color filter can be red, green or blue. The method to form color filter (570) can be photo lithography, gravure printing or inkjet printing.

In this embodiment, silicon nitride insulating layer (580) is formed on the color filter to protect color filter (570). Pixel electrode (PE5) is formed on the Silicon nitride insulating layer (580). The pixel electrode (PE5) may be Indium Tin Oxide (ITO) or Indium Zinc Oxide (IZO) which are transparent and conductive. The pixel electrode is connected to the drain electrode electrically through a contact hole formed in the color filter. A black matrix can be formed on the Thin Film Transistor. The black matrix can also play a role as a column spacer.

Figure 9:
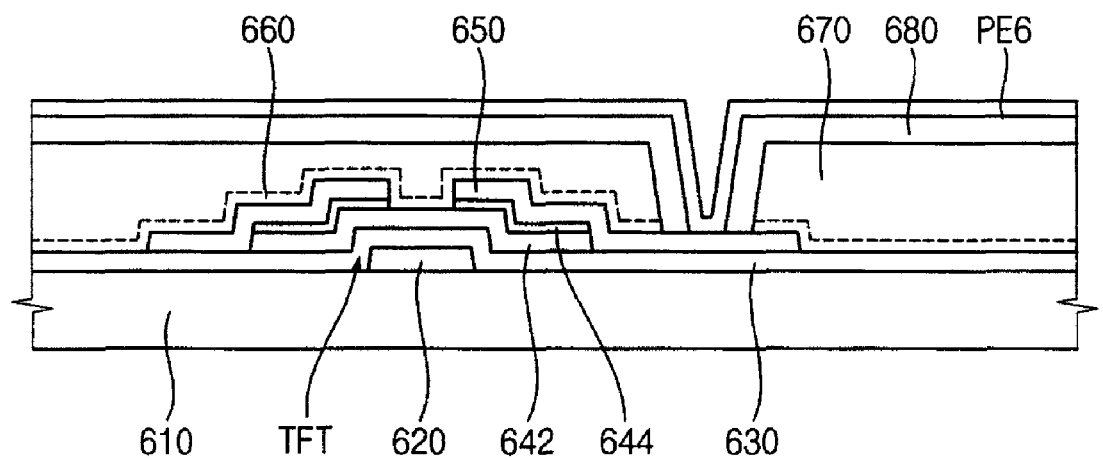
FIG. 9 is a sectional view of a TFT substrate which has a color filter according to another embodiment of the present invention.

FIG. 9 is a sectional view of a TFT substrate which has a color filter according to another embodiment of the present invention. In this embodiment, because components except for organic insulating layer are substantially same as the embodiment in FIG. 6 to FIG. 8d, a repeated explanation will be skipped.

Referring to FIG. 9, red, green, blue color filter (670) is formed on the same layer that the TFT is formed. A pattern gate metal layer is formed on the substrate (610) to form a gate line and gate electrode (620).

Figure 10A:
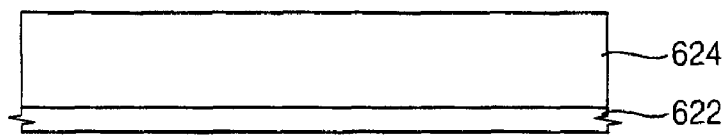
FIGS. 10a-10d each illustrate sectional views of a gate electrode extended from the gate line in FIG. 9 according to another embodiment of the present invention.

FIG. 10a is a sectional view of a gate electrode extended from the gate line in FIG. 9 according to another embodiment of the present invention.

Referring to FIG. 10a, the gate metal layer includes copper layer (624) and copper solid solution layer (Cu(N(x)O(1-x)), $0 \leq x \leq 1$, $0 < a < 1$) including at least one of oxygen and nitrogen. The copper solid solution layer (622) is formed under the copper layer (624).

Figure 10B:
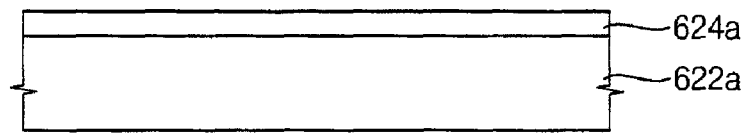

FIG. 10b is a sectional view of a gate electrode extended from the gate line in FIG. 9 according to another embodiment of the present invention.

Referring to FIG. 10b, the gate metal layer includes copper layer (622a) and copper solid solution layer (624a) (Cu(N(x) O(1-x)), $0 \leq x \leq 1$, $0 < a < 1$) including at least one of oxygen and nitrogen. The copper solid solution layer (624a) is formed on the copper layer (622b).

Figure 10C:
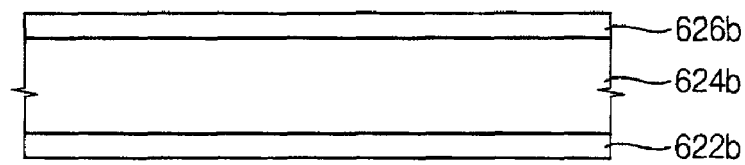

FIG. 10c is a sectional view of a gate electrode extended from the gate line in FIG. 9 according to another embodiment of the present invention.

Referring to FIG. 10c, the gate metal layer can be a multi layer having a copper layer (624b) that is disposed between $1^{st}$ copper solid solution layer and $2^{nd}$ copper solid solution layer (622b,626b).

Figure 10D:
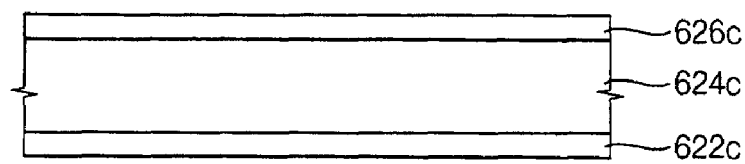

FIG. 10d is a sectional view of a gate electrode extended from the gate line in FIG. 9 according to another embodiment of the present invention.

Referring to FIG. 10d, the gate metal layer can be a multi layer including copper layer (624c), metal layer (622c)

formed under the copper layer and copper solid solution layer (626c) formed on the copper layer (624c).

Referring back to FIG. 9, gate insulating layer (630) is formed after patterning gate metal layer. A semiconductor pattern is formed on the gate insulating layer which includes a semiconductor layer (642) and ohmic contact layer (644). A data metal layer (650) is then formed which contains source line, source electrode and drain electrode.

Figure 11A:
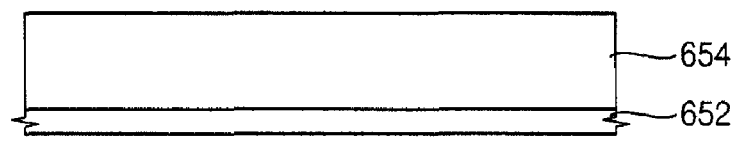
FIGS. 11a-11d each illustrate sectional views of a data line, a source electrode and a drain electrode according to another embodiment of the present invention.

FIG. 11a is a sectional view of a data line, a source electrode and a drain electrode according to another embodiment of the present invention.

Referring to FIG. 11a, the data metal layer (650 in FIG. 9) includes copper layer (654) and copper solid solution layer (652) ($Cu(N(x)O(1-x))$, $0 \leq x \leq 1$, $0 < a < 1$) including at least one of oxygen and nitrogen. The copper solid solution layer is formed under the copper layer.

Figure 11B:
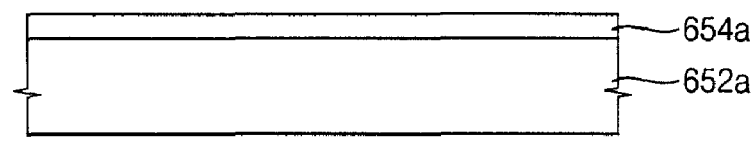

FIG. 11b is a sectional view of a data line, a source electrode and a drain electrode according to another embodiment of the present invention.

Referring to FIG. 11b, the data metal layer (650 in FIG. 9) includes copper layer (654a) and copper solid solution layer (652a) ($Cu(N(x)O(1-x))$, $0 \leq x \leq 1$, $0 < a < 1$) including at least one of oxygen and nitrogen. The copper solid solution layer (652a) is formed on the copper layer (654a).

Figure 11C:
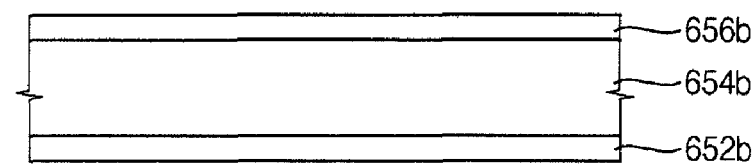

FIG. 11c is a sectional view of a data line, a source electrode and a drain electrode according to another embodiment of the present invention.

Referring to FIG. 11c, data metal layer (650 in FIG. 9) can be a multi layer. In the multilayer, a copper layer (654b) is disposed between $1^{st}$ copper solid solution layer (652b) and $2^{nd}$ copper solid solution layer (656b).

Figure 11D:
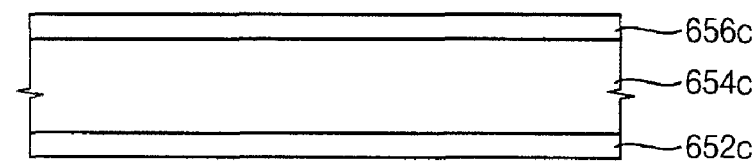

FIG. 11d is a sectional view of a data line, a source electrode and a drain electrode according to another embodiment of the present invention.

Referring to FIG. 11d, the data metal layer (650 in FIG. 9) can be a multi layer including copper layer (654c), metal layer (652c) formed under the copper layer and copper solid solution layer (656c) formed on the copper layer Referring back to FIG. 9, protection insulating layer (660) can be formed on the data metal layer. The color filter layer (670) is formed on the substrate having the data metal layer pattern or having the protection insulating layer.

In this embodiment, organic insulating layer (680) is formed on the color filter to protect the color filter. Pixel electrode (PE6) is formed on the Silicon nitride insulating layer. The pixel electrode may be Indium Tin Oxide (ITO) or Indium Zinc Oxide (IZO) which are transparent and conductive. The pixel electrode (PE6) is connected to the drain electrode electrically through a contact hole formed in the color filter. A black matrix can be formed on the Thin Film Transistor. The black matrix can play a role as a column spacer also.

According to this embodiment, color filter (670) is protected and surface flatness of the substrate is enhanced by forming of the organic insulating layer.

Figure 12:
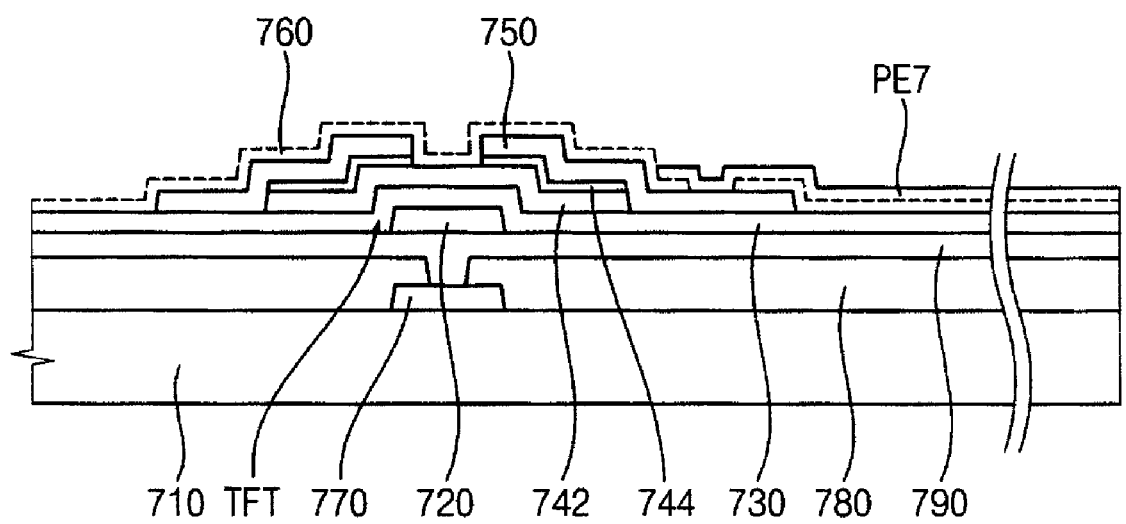
FIG. 12 is a sectional view of a TFT substrate which has a color filter according to still another embodiment of the present invention.

FIG. 12 is a sectional view of a TFT substrate which has a color filter (780) according to still another embodiment of the present invention.

Referring to FIG. 12, a Thin Film Transistor can be formed on the insulating substrate (710) that the color filter is already formed. According to this embodiment, the substrate includes a display area and peripheral area.

The step of forming the black matrix (770) on the insulating substrate can be skipped in this embodiment. The black matrix (770) has an opening and is formed corresponding to the display area. The next step is form a color filter. The color filter can overlap each other on an edge. Over coating layer (790) or an insulating layer can be formed to be flat and protect the color filter. On the over coating layer or insulating layer, a gate metal layer is patterned to form a gate line and a gate electrode (720).

Figure 13A:
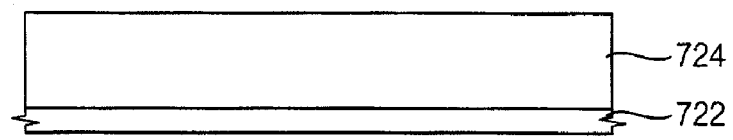
FIGS. 13a-13d each illustrate sectional views of a gate electrode extended from the gate line in FIG. 12 according to still another embodiment of present invention.

FIG. 13a is a sectional view of a gate electrode extended from the gate line in FIG. 12 according to still another embodiment of present invention.

Referring to FIG. 13a, the gate metal layer includes copper layer (724) and copper solid solution layer (722) ($Cu(N(x)O(1-x))$, $0 \leq x \leq 1$, $0 < a < 1$) including at least one of oxygen and nitrogen. The copper solid solution layer is formed under the copper layer.

Figure 13B:
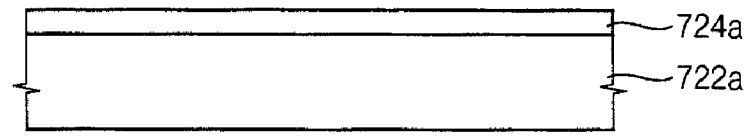

FIG. 13b is a sectional view of a gate electrode extended from the gate line in FIG. 12 according to still another embodiment of the present invention.

Referring to FIG. 13b, the gate metal layer includes a copper layer (722a) and copper solid solution layer ($Cu(N(x)O(1-x))$, $0 < x < 1$, $0 < a < 1$) (724a) including at least one of oxygen and nitrogen. The copper solid solution layer (724a) is formed on the copper layer (722a).

Figure 13C:
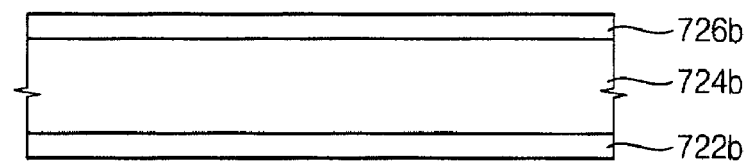

FIG. 13c is a sectional view of a gate electrode extended from the gate line in FIG. 12 according to still another embodiment of the present invention.

Referring to FIG. 13c, the gate metal layer can be a multi layer. In the multi layer, copper layer (724b) is disposed between $1^{st}$ copper solid solution layer (722b) and $2^{nd}$ copper solid solution layer (726b).

Figure 13D:
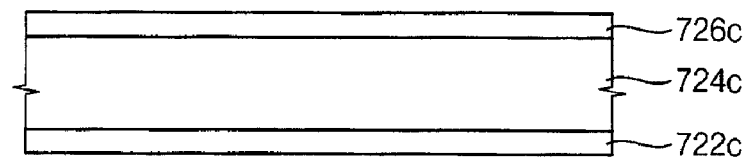

FIG. 13d is a sectional view of a gate electrode extended from the gate line in FIG. 12 according to still another embodiment of present invention.

Referring to FIG. 13d, the gate metal layer can be a multi layer including a copper layer, a metal layer (722c) formed under the copper layer (724c) and copper solid solution layer (726c) formed on the copper layer (724c).

Referring back to FIG. 12, on the overcoating layer (790), gate insulating layer (730) is formed. Gate insulating layer (730) insulates between the gate electrode and semiconductor pattern. The gate insulating layer (730) may be a SiNy. The gate insulating layer (730) may include a ($Si(Ox, N(-X))$) ($0 \leq x \leq 1$)) layer which has silicon and at least one of oxygen or nitrogen. The gate insulating layer (730) can be either a single layer of the SiNy layer or multi layer that includes the SiNy layer and ($Si(Ox, N(-X))$) ($0 \leq x \leq 1$)) layer which has silicon and at least one of oxygen or nitrogen.

The semiconductor pattern (742,744) is formed on the gate insulating layer. The semiconductor pattern corresponds to the gate electrode. The semiconductor pattern includes a semiconductor layer and ohmic contact layer formed on the semiconductor layer. A data metal layer pattern (750) is then formed which contains a source line, source electrode and drain electrode.

Figure 14A:
FIGS. 14a-14d each illustrate sectional views of a data line, a source electrode and a drain electrode according to another embodiment of present invention.

FIG. 14a is a sectional view of a data line, a source electrode and a drain electrode according to another embodiment of present invention.

Referring to FIG. 14a, the data metal layer includes copper layer (754) and copper solid solution layer (752) ($Cu(N(x)O(1-x))$, $0 \leq x \leq 1$, $0 < a < 1$) including at least one of oxygen and nitrogen. The thickness of the copper solid solution may be in a range of 30 Å-1000 Å. The copper solid solution layer is formed under the copper layer. The semiconductor pattern, ohmic contact layer, source line, and drain electrode can be formed by only 1 photo lithography process in some embodiments of the invention. In other embodiments of the invention, the semiconductor pattern, ohmic contact layer, source line and drain electrode can be formed by a photo lithography process with more than 1 mask.

Figure 14B:
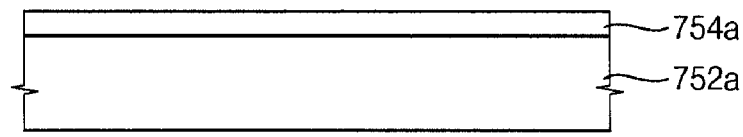

FIG. 14b is a sectional view of a data line, a source electrode and a drain electrode according to another embodiment of present invention.

Referring to FIG. 14b, the data metal layer includes copper layer (754a) and copper solid solution layer (752a) (Cu(N(x) O(1−x)), 0≦x≦1, 0<a<1) including at least one of oxygen and nitrogen. The copper solid solution layer is formed on the copper layer.

Figure 14C:
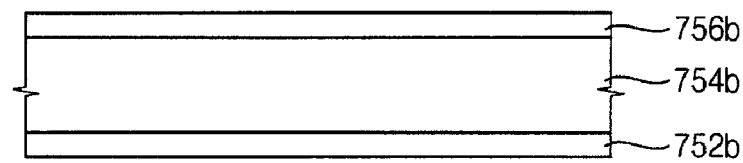

FIG. 14c is a sectional view of a data line, a source electrode and a drain electrode according to another embodiment of present invention.

Referring to FIG. 14c, data metal layer (750) can be a multi layer in which copper layer (754b) is disposed between $1^{st}$ copper solid solution layer (752b) and $2^{nd}$ copper solid solution layer (756b).

Figure 14D:
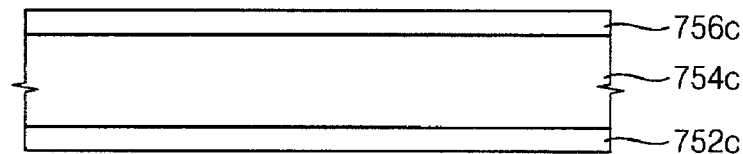

FIG. 14d is a sectional view of a data line, a source electrode and a drain electrode according to another embodiment of present invention.

Referring to FIG. 14d, the data metal layer (750) can be a multi layer including copper layer (754c), metal layer (752c) formed under the copper layer and copper solid solution layer (756c) formed on the copper layer Referring back to FIG. 12, protection insulating layer (760) can be formed on the data metal layer. The pixel electrode is formed on the protection insulating layer. The pixel electrode (PE7) may be Indium Tin Oxide (ITO) or Indium Zinc Oxide (IZO) which are transparent and conductive. The pixel electrode (PE7) is connected to the drain electrode electrically through a contact hole formed in the color filter. A black matrix can be formed on the Thin Film Transistor. The black matrix can play a role as a column spacer also.

Above embodiments are not limited to a bottom gate Thin Film Transistor. It also can be applied to a top gate Thin Film Transistor. And gate metal layer and source metal layer including copper layer and copper solid solution layer, gate insulating layer and/or passivation layer which has at least one of oxygen and nitrogen.

What is claimed is:

1. A thin film transistor substrate comprising:
   an insulating substrate;
   a metal layer on the insulating substrate, the metal layer comprising a copper layer and a copper solid solution layer, the copper solid solution layer comprising copper and Oxygen; and
   an insulating layer on the substrate and covering the metal layer.

2. The thin film transistor substrate of claim 1, wherein the copper solid solution layer comprises a first copper solid solution layer formed under the copper layer and a second copper solid solution layer formed on top of the copper layer.

3. The thin film transistor substrate of claim 1, wherein the copper solid solution layer is formed on the copper layer.

4. The thin film transistor substrate of claim 1, wherein the copper solid solution layer is formed on the insulating substrate and the copper layer is formed on the copper solid solution layer.

5. The thin film transistor substrate of claim 4, wherein the metal layer is a gate line connected to the gate electrode of the thin film transistor.

6. The thin film transistor substrate of claim 4, further comprising semiconductor pattern and a second metal layer, the second metal layer comprising data line, source electrode and drain electrode.

7. The thin film transistor substrate of claim 6, wherein the second metal layer comprises a copper layer and a copper solid solution layer, the copper solid solution layer comprising copper and oxygen.

8. The thin film transistor substrate of claim 7, wherein the copper solid solution layer of the second metal layer comprises a third copper solid solution layer formed under the copper layer and a fourth copper solid solution layer formed on top of the copper layer.

9. The thin film transistor substrate of claim 1, wherein the insulating layer comprises silicon and at least one of the oxygen or nitrogen.

10. The thin film transistor substrate of claim 9, wherein the insulating layer further comprising Silicon nitride (SiNy) formed on the insulating layer.

11. The thin film transistor substrate of claim 6, further comprising a color filter layer, the color filter layer formed on the second metal layer comprising red, green, blue color filters.

12. The thin film transistor substrate of claim 1, further comprising a color filter layer formed on the insulating substrate and the metal layer.

13. The thin film transistor substrate of claim 12, further comprising a black matrix, wherein the black matrix is formed on the substrate such that at least a portion of the color filter layer covers the black matrix.

14. A method of manufacturing a thin film transistor array panel on an insulating substrate, the method comprising:
   forming a metal layer on the insulating substrate, the metal layer comprising a copper layer and a copper solid solution layer, the copper solid solution layer comprising copper and Oxygen; and
   forming an insulating layer on the insulating substrate and covering the metal layer.

15. The method of claim 14, wherein the copper solid solution layer is formed on the insulating substrate and the copper layer is formed on the copper solid solution layer.

16. The method of claim 14, wherein the insulating layer comprises silicon and at least one of oxygen and nitrogen.

17. The method of claim 16, wherein the insulating layer further comprises silicon nitride (SiNy).

18. The method of claim 14, further comprising forming a semi-conductor pattern and a second metal layer, the second metal layer comprising a data line, a source electrode and a drain electrode.

19. The method of claim 18, wherein the second metal layer comprises a copper layer and a copper solid solution layer, the copper solid solution layer comprising copper and oxygen.

20. The method of claim 18, further comprising forming a color filter layer, wherein the color filter layer formed on the second metal layer comprises red, green, blue color filters.

21. The method of claim 14, further comprising forming a color filter layer, wherein the color filter layer is formed on the insulating substrate before forming the metal layer.

22. The method of claim 21, further comprising forming a black matrix layer, wherein the black matrix layer is formed on the insulating substrate before forming color filter layer.

23. A thin film transistor substrate comprising:
   an insulating substrate;
   a metal layer on the insulating substrate, the metal layer comprising a copper layer and a copper solid solution layer, the copper solid solution layer comprising copper, Oxygen and Nitrogen; and
   an insulating layer on the substrate and covering the metal layer.

24. The thin film transistor substrate of claim 23, wherein the copper solid solution layer comprises a first copper solid solution layer formed under the copper layer and a second copper solid solution layer formed on top of the copper layer.

25. The thin film transistor of claim 23, wherein the copper solid solution layer is formed on the copper layer.

26. The thin film transistor of claim 23, wherein the copper solid solution layer is formed on the insulating substrate and the copper layer is formed on the copper solid solution layer.

27. The thin film transistor of claim 26, wherein the metal layer is a gate line connected to the gate electrode of the thin film transistor.

28. The thin film transistor of claim 26, further comprising semiconductor pattern and a second metal layer, the second metal layer comprising data line, source electrode and drain electrode.

29. The thin film transistor of claim 28, wherein the second metal layer comprises a copper layer and a copper solid solution layer, the copper solid solution layer comprising copper, oxygen and nitrogen.

30. The thin film transistor of claim 29, wherein the copper solid solution layer of the second metal layer comprises a third copper solid solution layer formed under the copper layer and a fourth copper solid solution layer formed on top of the copper layer.

31. The thin film transistor of claim 23, wherein the insulating layer comprises silicon and at least one of the oxygen or nitrogen.

32. The thin film transistor of claim 31, wherein the insulating layer further comprising Silicon nitride (SiNy) formed on the insulating layer.

33. The thin film transistor of claim 28, further comprising a color filter layer, the color filter layer formed on the second metal layer comprising red, green, blue color filters.

34. The thin film transistor of claim 23, further comprising a color filter layer, wherein the color filter is formed on the substrate before forming the metal layer.

35. The thin film transistor of claim 34, further comprising a black matrix, wherein the black matrix is formed on the substrate before forming the color filter layer.

* * * * *